(12) United States Patent
Tanaka et al.

(10) Patent No.: US 8,567,314 B2
(45) Date of Patent: Oct. 29, 2013

(54) SCREEN PRINT SYSTEM AND METHOD FOR CLEANING A MASK OF THE SAME

(75) Inventors: Tetsuya Tanaka, Yamanashi (JP); Kunihiko Tokita, Yamanashi (JP)

(73) Assignee: Panasonic Corporation, Osaka (JP)

( * ) Notice: Subject to any disclaimer, the term of this patent is extended or adjusted under 35 U.S.C. 154(b) by 164 days.

(21) Appl. No.: 13/254,517

(22) PCT Filed: Dec. 13, 2010

(86) PCT No.: PCT/JP2010/007239
§ 371 (c)(1),
(2), (4) Date: Sep. 2, 2011

(87) PCT Pub. No.: WO2011/074240
PCT Pub. Date: Jun. 23, 2011

(65) Prior Publication Data
US 2011/0315033 A1    Dec. 29, 2011

(30) Foreign Application Priority Data
Dec. 16, 2009 (JP) .................................. 2009-284687

(51) Int. Cl.
*B41F 35/00* (2006.01)
(52) U.S. Cl.
USPC ......................................... 101/425; 101/129
(58) Field of Classification Search
USPC ....................................................... 101/425
See application file for complete search history.

(56) References Cited

U.S. PATENT DOCUMENTS

| 4,472,047 A | * | 9/1984 | Stoudt | 399/184 |
| 4,911,074 A | * | 3/1990 | Simila | 101/425 |
| 5,491,871 A | * | 2/1996 | Reber et al. | 15/308 |
| 5,865,117 A | * | 2/1999 | Asai et al. | 101/424 |

(Continued)

FOREIGN PATENT DOCUMENTS

| JP | 61-164895 A | 7/1986 |
| JP | 2-71667 U | 5/1990 |

(Continued)

OTHER PUBLICATIONS

International Search Report for PCT/JP2010/007239 dated Jan. 18, 2011.

Primary Examiner — Anthony Nguyen
(74) Attorney, Agent, or Firm — Pearne & Gordon LLP (57) ABSTRACT

It is an objective to provide a screen print system and a method for cleaning a mask of the screen print system that enable sufficient cleaning of the mask used for subjecting a cavity substrate to screen printing. A screen print system includes a first cleaning unit 16a and a second cleaning unit 16b. The first cleaning unit 16a sequentially brings a mask contact area R, which is formed by stretching a paper member 42 over an upper end of a nozzle part 41, into contact with lower surfaces of respective convex portions 13t of a first mask 13a, thereby removing paste Pst adhering to the respective lower surfaces of the respective convex portions 13t. The second cleaning unit 16b brings the mask contact area R, which is formed by stretching the paper member 42 over the upper end of the nozzle part 41, into contact with a lower surface of a second mask 13b, thereby removing the paste Pst adhering to the lower surface of the second mask 13b. The first cleaning unit 16a winds up the paper member 42 while removing the paste Pst adhering to the lower surfaces of the convex portions 13t of the first mask 13a.

2 Claims, 10 Drawing Sheets

(56) References Cited

U.S. PATENT DOCUMENTS

| | | |
|---|---|---|
| 5,901,405 A * | 5/1999 | Tani .................................. 15/302 |
| 6,036,994 A | 3/2000 | Tanaka et al. |
| 6,202,551 B1 | 3/2001 | Murakami |
| 6,217,669 B1 * | 4/2001 | Sarashina et al. ................ 134/18 |
| 6,638,363 B2 * | 10/2003 | Erdmann ............................ 134/9 |
| 7,469,635 B2 * | 12/2008 | Marszalkowski, Jr. ........ 101/129 |
| 2004/0108368 A1 | 6/2004 | Onishi et al. |
| 2004/0237999 A1 * | 12/2004 | Shiozawa ........................ 134/1.3 |

FOREIGN PATENT DOCUMENTS

| | | |
|---|---|---|
| JP | 10-296960 A | 11/1998 |
| JP | 2000-168040 A | 6/2000 |
| JP | 2004-066832 A | 3/2004 |

\* cited by examiner

SCREEN PRINT SYSTEM AND METHOD FOR CLEANING A MASK OF THE SAME

TECHNICAL FIELD

The present invention relates to a screen print system that subjects a so-called cavity substrate, which has electrodes mounted on an upper surface of a substrate body and electrodes mounted on bottom surfaces of respective apertures formed in the upper surface of the substrate body, to screen printing as well as to a method for cleaning a mask of the screen print system.

BACKGROUND ART

Among substrates on which electronic components are to be mounted, a so-called cavity substrate having electrodes mounted on bottom surfaces of respective apertures (cavities) formed in an upper surface of a substrate body as well as electrodes mounted on the upper surface of the substrate body has hitherto been known. Since the cavity substrate enables three dimensional arrangement of electronic components, the cavity substrate can make up a compact, high-density substrate.

In relation to such a cavity substrate, in order to print the electrodes mounted on the bottom surfaces of the respective cavities (i.e., cavity-area electrodes) and the electrodes mounted on the upper surface of the substrate body (i.e., flat-area electrodes) with paste, like solder, there has been used a screen print system built by coupling a first screen printer to a second screen printer. Specifically, the first screen printer subjects the substrate to screen printing by use of a mask having pattern holes that are provided on downwardly-projecting convex portions to be fitted to the respective cavities and that correspond to the respective cavity-area electrodes. The second screen printer subjects the substrate to screen printing by use of a mask having pattern holes corresponding to the respective flat-area electrodes.

Some of such screen print systems have hitherto been known to have cleaning units provided for the respective screen printers (see; for instance, Patent Document 1). After the substrate has finished undergoing screen printing, the cleaning unit is relatively actuated with respect to a mask in order to prepare for screen printing that is to be performed for a next substrate to be loaded. The cleaning unit brings a mask contact area, which is made by stretching a paper member over an upper end of the cleaning unit, into contact with a lower surface of the mask, to thus clean the paste adhering to the lower surface of the mask.

RELATED ART DOCUMENT

Patent Document

Patent Document 1: JP-A-2004-66832

SUMMARY OF THE INVENTION

Problem that the Invention is to Solve

However, when the cleaning unit cleans a lower surface of the mask having the convex portions fitting to the respective cavities, the paper member is sequentially brought into contact with lower surfaces of the respective convex portions. When the paper member comes into contact with a convex portion to be cleaned next after removal of paste from the lower surface of one convex portion has ended, the paste removed from the preceding convex portion is sometimes rubbed against the next convex portion, which makes cleaning of the mask inadequate, to thus worsen precision of screen printing.

Accordingly, the present invention aims at providing a screen print system and a method for cleaning a mask of the screen print system that enable sufficient cleaning of the mask used in subjecting a cavity substrate to screen printing.

Means for Solving the Problem

A screen print system of the present invention is a screen print system built by coupling a first screen printer to a second screen printer, wherein the first screen printer positions a substrate having a plurality of first electrodes provided on respective bottom surfaces of a plurality of cavities formed in portions of an upper surface of a substrate body and a plurality of second electrodes provided on the upper surface of the substrate body and brings into contact with the upper surface of the substrate a first mask having first pattern holes that correspond to the respective first electrodes and that are formed in each of a plurality of downwardly-protruding convex portions to be fit into the respective cavities of the substrate body, thereby subjecting the first electrodes to screen printing, and wherein the second screen printer positions the substrate subjected to screen printing by means of the first screen printer and brings a flat-plate-shaped second mask having second pattern holes corresponding to the respective second electrodes into contact with the upper surface of the substrate, so as to subject the second electrodes to screen printing, the screen print system further including a first cleaning unit and a second cleaning unit, wherein the first cleaning unit performs relative movement with respect to the first mask, thereby sequentially bringing a mask contact area, which is formed by stretching a paper member over an upper end of a paper member support part, into contact with lower surfaces of the respective convex portions of the first mask, thereby removing past adhering to the respective lower surfaces of the respective convex portions of the first mask, and wherein the second cleaning unit performs relative movement with respect to the second mask, thereby bringing the mask contact area, which is formed by stretching the paper member over the upper end of the paper member support part, into contact with a lower surface of the second mask, thereby removing the paste adhering to the lower surface of the second mask, and wherein the first cleaning unit has a paper member winding-up unit that winds up the paper member while removing the paste adhering to the lower surfaces of the convex portions of the first mask.

A method for cleaning a mask of a screen print system of the present invention is a method for cleaning a mask of a screen print system built by coupling a first screen printer to a second screen printer, wherein the first screen printer positions a substrate having a plurality of first electrodes provided on respective bottom surfaces of a plurality of cavities formed in portions of an upper surface of a substrate body and a plurality of second electrodes provided on the upper surface of the substrate body and brings into contact with the upper surface of the substrate a first mask having first pattern holes that correspond to the respective first electrodes and that are formed in each of a plurality of downwardly-protruding convex portions to be fit into the respective cavities of the substrate body, thereby subjecting the first electrodes to screen printing, and wherein the second screen printer positions the substrate subjected to screen printing by means of the first screen printer and brings a flat-plate-shaped second mask having second pattern holes corresponding to the respective second electrodes into contact with the upper surface of the substrate, thereby subjecting the second electrodes to screen printing, the method including a step of relatively actuating a first cleaning unit having a mask area, which is formed by stretching a paper member over an upper end of a paper member support part, with respect to the first mask, thereby sequentially bringing the mask contact area into contact with lower surfaces of respective convex portions of the first mask, to thus remove paste adhering to the lower surfaces of the respective convex portions of the first mask and another step of relatively actuating a second cleaning unit having the mask contact area, which is formed by stretching the paper member over the upper end of the paper member support part, with respect to the second mask, thereby bringing the mask contact area formed from a portion of the paper member into contact with a lower surface of the second mask, to thus remove the paste adhering to the lower surface of the second mask, wherein, in the step of removing the paste adhering to the lower surfaces of the respective convex portions of the first mask by the first cleaning unit, the paper member is winded up while removing the paste adhering to the lower surfaces of the convex portions of the first mask.

Advantage of the Invention

In the present invention, after a mask contact area of a paper member has been brought into contact with a lower surface of one of convex portions of a first mask, to thus remove paste adhering to the lower surface, the paper member is winded up before the paper member contacts a next convex portion to be subjected to removal of paste, to thus update the mask contact area. When the paper member contacts the next convex portion to be subjected to removal of paste after removal of the paste from one convex portion, the paste removed from the previous convex portion will not be rubbed against the subsequent convex portion. Therefore, the mask used for subjecting a cavity substrate to screen printing can be sufficiently cleaned, so that the accuracy of printing can be enhanced. The paper member is winded up while removing the paste adhering to the lower surface of the convex portion. Therefore, even when the convex portions are adjacent to each other at an extremely short distance, it is possible to prevent the paste removed from the previous convex portion from being rubbed against the subsequent convex portion without fail.

BRIEF DESCRIPTION OF THE DRAWINGS

FIG. 6(a) is an oblique perspective view of a cleaning unit provided in each of the screen printers of the embodiment of the present invention, and FIG. 6(b) it is a partial cross sectional side view of the same.

FIGS. 7(a), (b), (c), and (d) are explanatory operation diagrams of the first screen printer of the embodiment of the present invention.

FIGS. 8(a), (b), (c), and (d) are explanatory operation diagrams of the second screen printer of the embodiment of the present invention.

FIGS. 9(a), (b), (c), and (d) are explanatory operation diagrams of the cleaning unit provided in the first screen printer of the embodiment of the present invention.

EMBODIMENT FOR IMPLEMENTING THE INVENTION

Figure 1:
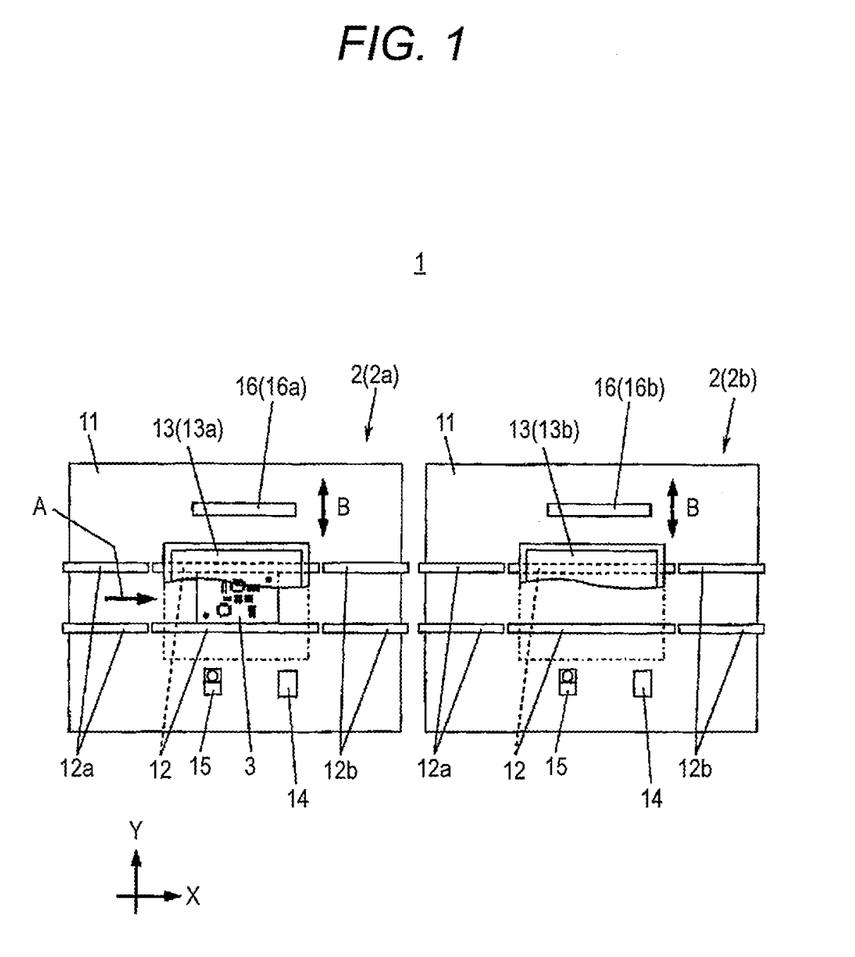
FIG. 1 is a plan view of a screen print system of an embodiment of the present invention.

An embodiment of the present invention is hereunder described by reference to the drawings. In FIG. 1, a screen print system 1 of the present embodiment is built by joining two screen printers 2 in a direction of conveyance of a substrate 3 (as designated by an arrow A shown in FIG. 1). The screen printer 2 disposed at an upstream position with respect to the direction of conveyance of the substrate 3 of the screen print system 1 (taken as a first screen printer 2a) performs carry-in and positioning of the substrate 3 loaded from the upstream position and subsequently subjects the substrate to screen printing. The substrate is then carried to another screen printer 2 (taken as a second screen printer 2b) disposed at a downstream position. The second screen printer 2b performs carry-in and positioning of the substrate 3 carried out of the first screen printer 2a and subsequently subjects the substrate to screen printing and carries the thus-printed substrate to an un-illustrated downstream unit (e.g., a component loader). For the convenience of explanation, a direction in a horizontal plane that corresponds to a direction of conveyance of the substrate 3 (i.e., a horizontal direction of a drawing sheet of FIG. 1) is taken as an X-axis direction, and a direction within a horizontal plane perpendicular to the X-axis direction (i.e., a vertical direction with respect to the drawing sheet of FIG. 1) is taken as a Y-axis direction. The vertical direction (i.e., the direction perpendicular to the drawing sheet of FIG. 1) is taken as a Z-axis direction.

Figure 2:
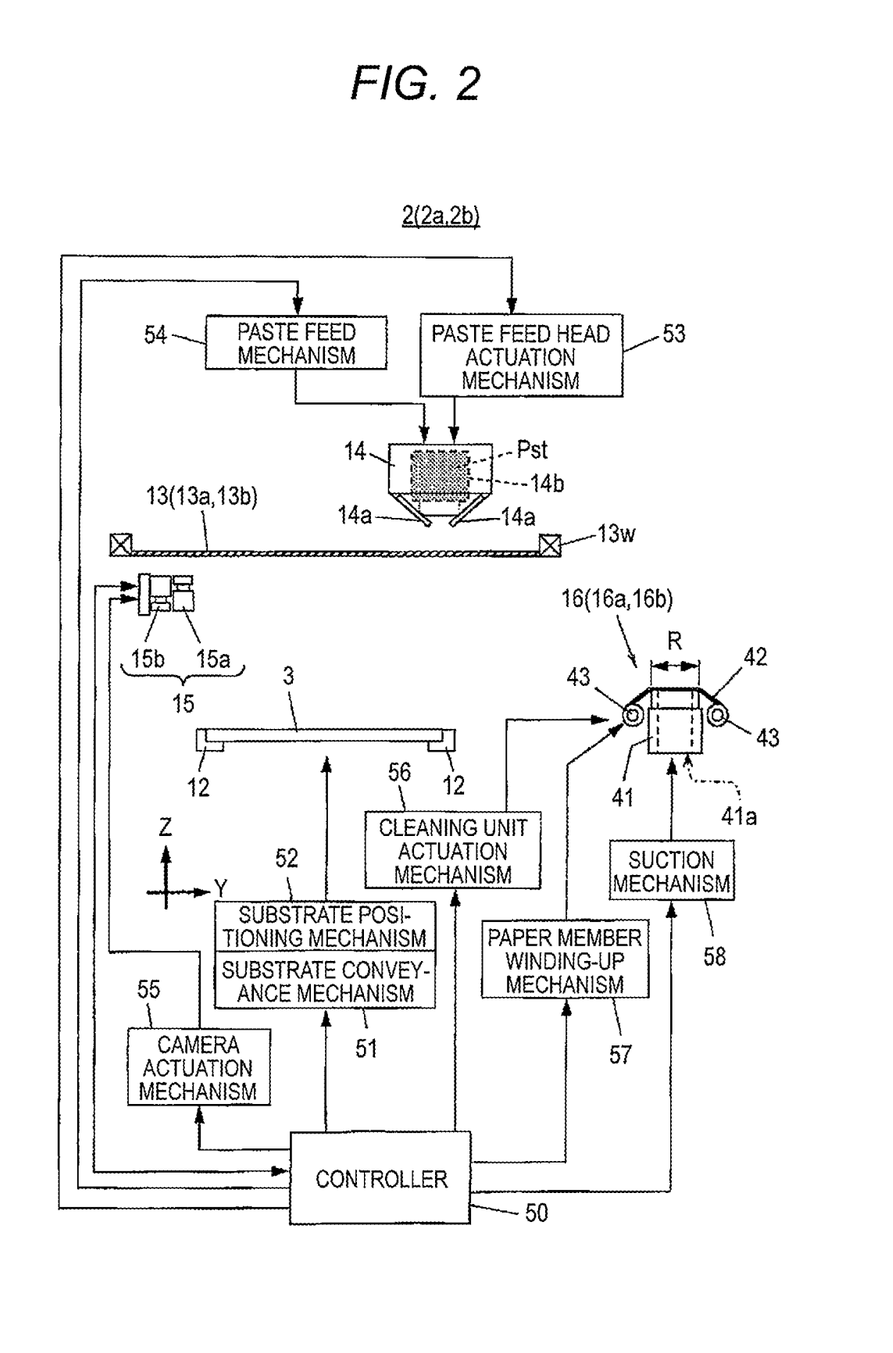
FIG. 2 is a schematic part diagram of screen printers making up the screen print system of the embodiment of the present invention.

In FIGS. 1 and 2, each of the two screen printers 2 (the first screen printer 2a and the second screen printer 2b) making up the screen print system 1 has a substrate holding part 12 built from a pair of conveyor mechanisms that position the substrate 3 on a base 11. In addition to a screen print mask 13, a paste feed head 14, a camera unit 15, and a cleaning unit 16 are placed at elevated positions over the substrate holding part 12 so as to be movable with respect to the base 11. In FIG. 1, a substrate carry-in part 12a and a substrate carry-out part 12b are provided at positions before and behind the substrate holding part 12 on the base 11 along a transport direction of the substrate 3 (i.e., the X-axis direction). The substrate carry-in part 12a is built from a pair of conveyor mechanisms that carry the substrate 3 loaded from the outside to the substrate holding part 12. The substrate carry-out part 12b built from a pair of conveyor mechanisms carries the substrate 3 received from the substrate holding part 12 to the outside.

Figure 3:
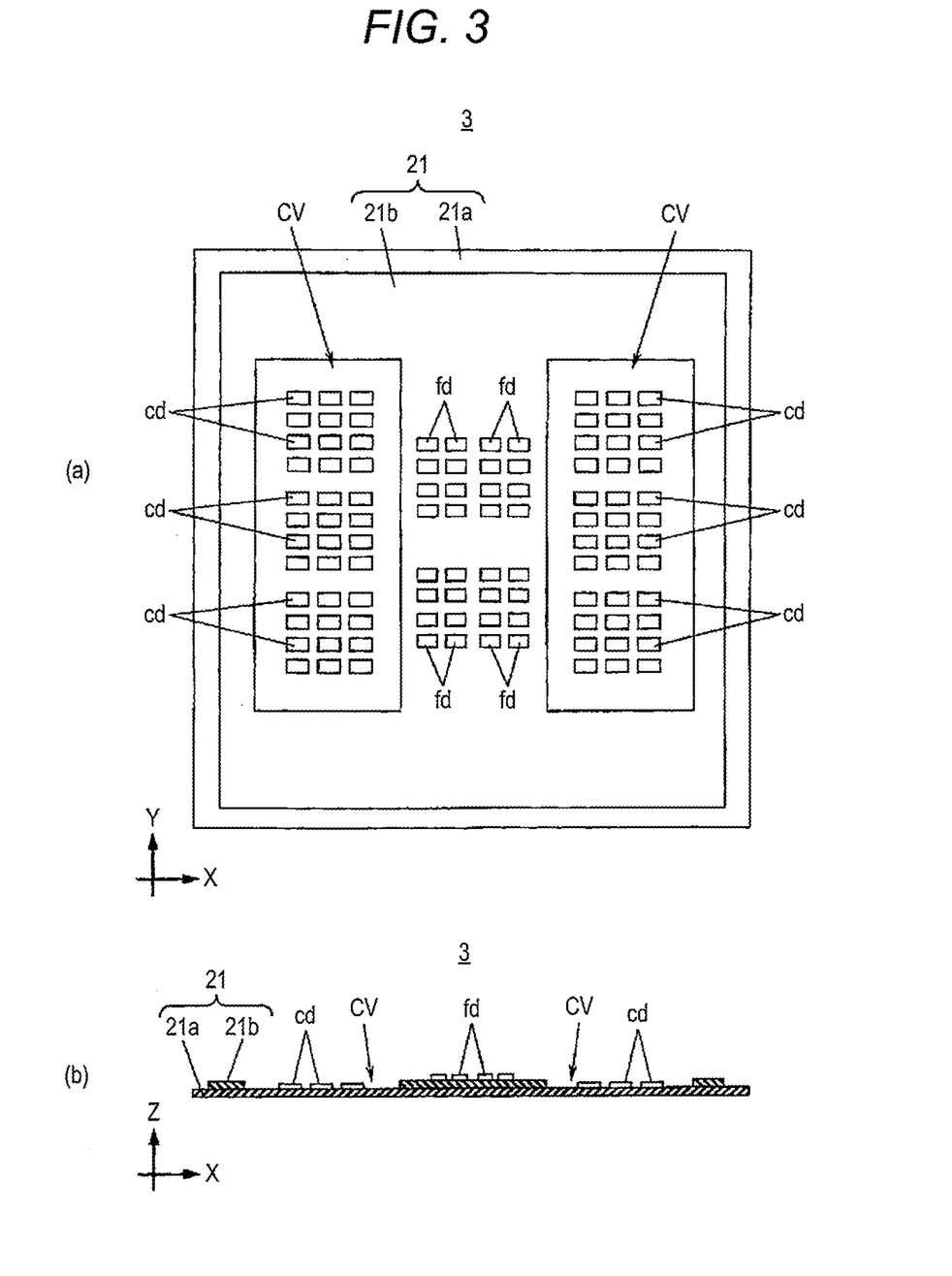
FIG. 3(a) is a plan view of a cavity substrate that is an object of printing performed by the screen print system of the embodiment of the present invention.
FIG. 3(b) is a side cross sectional view of the same.

In FIGS. 3(a) and (b), the substrate 3 is basically formed from a substrate body 21 that is made by bonding an upper-layer-side substrate member 21b to an upper surface of a lower-layer-side substrate member 21a. A plurality of flat-area electrodes fd are provided on an upper surface of the substrate body 21 (i.e., an upper surface of the upper-layer-side substrate member 21b). Further, a plurality of cavity-area electrodes cd are provided on respective bottom surfaces of cavities CV (i.e., the upper surface of the lower-layer-side substrate member 21a) that are apertures formed in portions of the upper surface of the substrate body 21 (i.e., portions of the upper-layer substrate member 21b). Specifically, the substrate 3 is a cavity substrate including the plurality of cavities CV formed in portions of the upper surface of the substrate body 21, the plurality of cavity-area electrodes cd (first electrodes) provided on the respective bottom surfaces of the plurality of cavities CV formed in portions of the upper surface of the substrate body 21, and the plurality of flat electrodes fd (second electrodes) provided on the upper surface of the substrate body 21.

Figure 4:
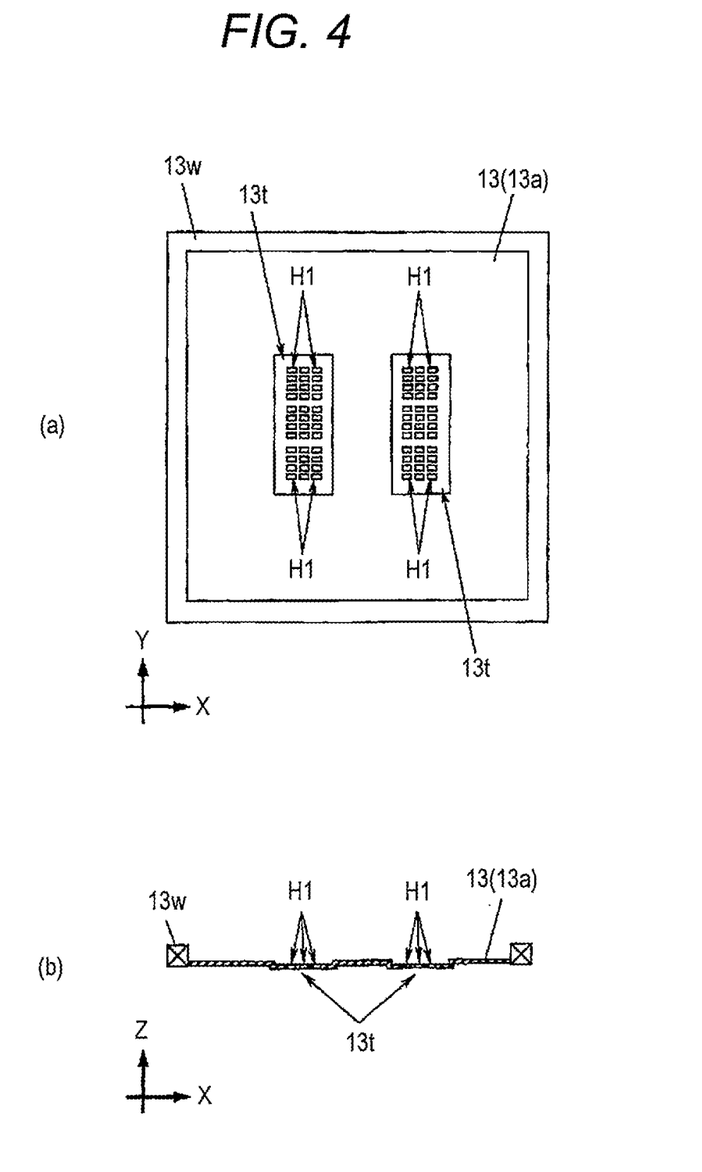
FIG. 4(a) is a plan view of a first mask of the screen print system of the embodiment of the present invention.
FIG. 4(b) is a side cross sectional view of the same.

The mask 13 provided for the first screen printer 2a differs in shape from the mask 13 provided for the second screen printer 2b. In FIGS. 4(a), (b) and FIGS. 5(a), (b), both the mask 13 (hereinafter taken as a first mask 13a) provided in the first screen printer 2a and the mask 13 (hereinafter taken as a second mask 13b) provided in the second screen printer 2b assume, on the whole, a rectangular shape. Four sides of each of the first mask and the second mask are surrounded by a frame member 13w.

Figure 5:
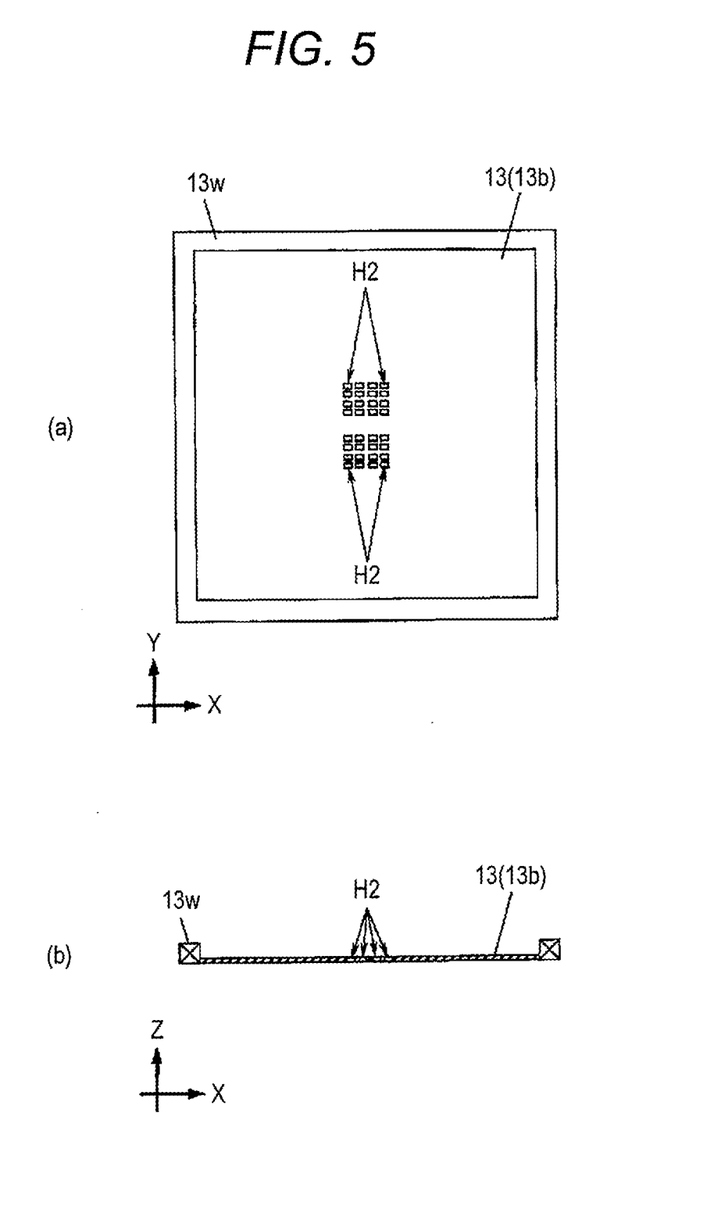
FIG. 5(a) is a plan view of a second mask of the screen print system of the embodiment of the present invention.
FIG. 5(b) is a side cross sectional view of the same.

In FIGS. 4(a) and (b), a plurality of convex portions 13t that downwardly protrude so as to fit respectively to the plurality of cavities CV provided in the substrate 3 are provided within an area surrounded by the frame member 13w of the first mask 13a. A plurality of pattern holes (hereinafter taken as "first pattern holes H1") corresponding to the plurality of cavity-area electrodes cd provided on the bottom surfaces of the respective cavities CV of the substrate 3 are provided in the respective convex portions 13t. In FIGS. 5(a) and (b), a plurality of pattern holes (hereinafter taken as "second pattern holes H2") corresponding to the plurality of flat-area electrodes fd provided on the substrate 3 are provided in the area surrounded by the frame member 13w of the second mask 13b.

In FIG. 2, the substrate holding part 12 provided in each of the screen printers 2 is provided so as to be movable in its entirety within a direction of a horizontal plane (i.e., a direction within an XY plane) and a vertical direction (a Z-axis direction). It is possible to place the substrate 3 held by the substrate holding part 12 at an arbitrary position below the mask 13 by means of moving the entire substrate holding part 12.

In FIG. 2, the paste feed head 14 provided in each of the screen printers 2 is disposed at an elevated position above the mask 13 so as to be movable within a direction of a horizontal plane (i.e., the direction within the XY plane) and the vertical direction (the Z-axis direction), and two guide parts 14a that oppose each other along the Y-axis direction are provided in a lower portion of the paste feed head. Each of the guide members 14a is made up of a spatula-shaped member extending in the X-axis direction and guides a flow channel of paste Pst in such a way that the paste Pst fed (or pumped) to a position lower than a paste cartridge 14b accommodated in the paste feed head 14 is fed concentrically to a target area on the mask 13.

Figure 6:
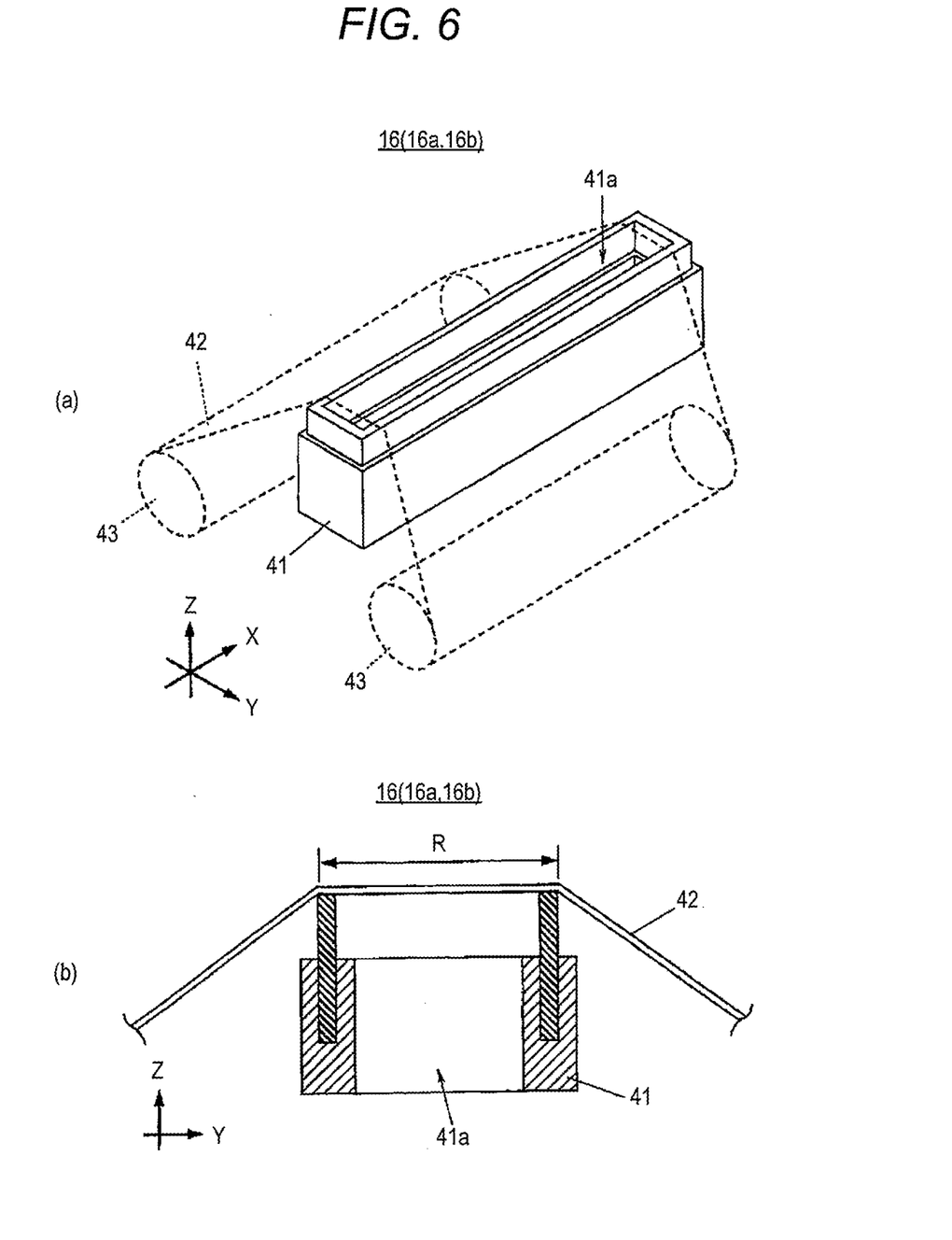

In FIG. 2 and FIGS. 6(a) and (b), the cleaning units 16 provided in the respective screen printers 2 (i.e., a first cleaning unit 16a provided in the first screen printer 2a and a second cleaning unit 16b provided in the second screen printer 2b) are provided so as to be movable on the whole in a direction within the horizontal plane (i.e., the Y-axis direction) (as designated by arrow B shown in FIG. 1). Each of the cleaning units 16 includes a nozzle part 41 corresponding to a paper member support part that has a horizontal upper end and that assumes a rectangular cylindrical closed cross sectional profile and a paper member 42 that extends in the Y-axis direction and that is stretched so as to pass over the upper end of the nozzle part 41 in the Y-axis direction. A portion of the paper member 42 stretched over the upper end of the nozzle part 41 forms a mask contact area R (see FIG. 6(b) and FIG. 1) that is brought into contact with a lower surface of the mask 13 from below by means of the nozzle part 41.

The first cleaning unit 16a provided in the first screen printer 2a performs relative movement with respect to the first mask 13a while the mask contact area R remains in contact with the respective lower surfaces of the convex portions 13t of the first mask 13a, thereby removing (wiping out) the paste Pst adhering to the lower surface of the first mask 13a. Further, the second cleaning unit 16b provided in the second screen printer 2b performs relative movement with respect to the second mask 13b while the mask contact area R remains in contact with the lower surface of the second mask 13b, thereby removing (wiping out) the paste Pst adhering to the lower surface of the second mask 13b. In each of the cleaning units 16, a pair of roller members 43, are disposed at positions where the nozzle part 41 is sandwiched between the pair of roller members along the Y-axis direction. The paper member 42 is winded up by means of rotary action of the pair of roller members 43, whereby the mask contact area R is updated.

In FIG. 2 and FIGS. 6(a) and (b), an air suction conduit 41a vertically penetrates through an interior of the nozzle part 41 of each of the cleaning units 16 (the first cleaning unit 16a and the second cleaning unit 16b). Vacuum pressure is fed to the interior of the air suction conduit 41a, whereby an air can be taken by suction into the air suction conduit 41a by way of the mask contact area R of the paper member 42.

Operation for conveying the substrate 3 stemming from operation of the substrate carry-in part 12a, operation of the substrate holding part 12, and operation of the substrate carry-out part 12b is carried out as a result of controllers 50 (FIG. 2) provided in the respective screen printers 2 controlling operation of a substrate conveyance mechanism 51 built from an un-illustrated actuator, or the like (FIG. 2). Further, operation for positioning the substrate 3 with respect to the mask 13 (the first mask 13a or the second mask 13b) of the substrate 3 stemming from actuation of the substrate holding part 12 in the direction of the horizontal plane and in the vertical direction is carried out as a result of the controllers 50 provided in the respective screen printers 2 controlling operation of a substrate positioning mechanism 52 (FIG. 2) made up of an un-illustrated actuator, or the like.

Operation for positioning the paste feed head 14 to the mask 13 stemming from actuation of the paste feed head 14 in the direction of the horizontal plane and the vertical direction is carried out as a result of the controllers 50 controlling operation of a paste feed head actuation mechanism 53 (FIG. 2) made up of an un-illustrated actuator. Further, operation for feeding the paste Pst from the paste feed head 14 is carried out as a result of the controllers 50 controlling operation of a paste feed mechanism 54 (FIG. 2) made up of an un-illustrated actuator, or the like.

In FIG. 2, the camera unit 15 is made up of a first camera 15a having an upwardly-oriented imaging field of view and a and a second camera 15b having a downwardly-oriented imaging field of view. Operation for actuating the camera unit 15 in the direction of the horizontal plane at a position beneath the mask 13 is carried out as a result of the controllers 50 controlling operation of a camera actuation mechanism 55 made up of an un-illustrated actuator, or the like. Moreover, the controllers 50 control imaging operations of the first camera 15a and the second camera 15b. Image data acquired by means of imaging operations of the first camera 15a and the second camera 15b are input to the controller 50 (FIG. 2).

Operation for positioning the cleaning units 16 (the first cleaning unit 16a and the second cleaning unit 16b) with respect to the mask 13 and actuating the same in the Y-axis direction is carried out as a result of the controllers 50 controlling operation of a cleaning unit actuation mechanism 56 (FIG. 2) made up of an un-illustrated actuator, or the like. Further, operation for winding-up the paper member 42 is performed by means of the pair of roller members 43 as a result of the controllers 50 controlling operation of a paper member winding-up mechanism 57 (FIG. 2) made up of an un-illustrated actuator, or the like. Further, operation for removing air by suction by way of the mask contact area R of the paper member 42 stemming from feeding vacuum pressure to an interior of the air suction conduit 41a is carried out as a result of the controllers 50 controlling operation of a suction mechanism 58 (FIG. 2) made up of an un-illustrated actuator, or the like.

In a step during which the screen print system 1 performs operation for subjecting the substrate 3 to screen printing, the substrate 3 is first loaded into the substrate carry-in part 12a of the first screen printer 2a. Upon detection of, by means of an un-illustrated detector, the substrate 3 being loaded into the substrate carry-in part 12a, the controller 50 of the first screen printer 2a activates the substrate conveyance mechanism 51, thereby letting the substrate holding part 12 receive the substrate 3 from the substrate carry-in part 12a and hold the thus-received substrate 3 (a first substrate holding step). After having let the substrate holding part 12 hold the substrate 3, the controller activates the substrate positioning mechanism 52, to thus actuate the substrate 3 in conjunction with the substrate holding part 12. The substrate 3 is thereby positioned with respect to the first mask 13 in such a way that the first pattern holes H1 provided in the first mask 13a opposes the cavity-area electrodes cd provided on the substrate 3 in the vertical direction (FIG. 7(a), a first positioning step).

Figure 7:
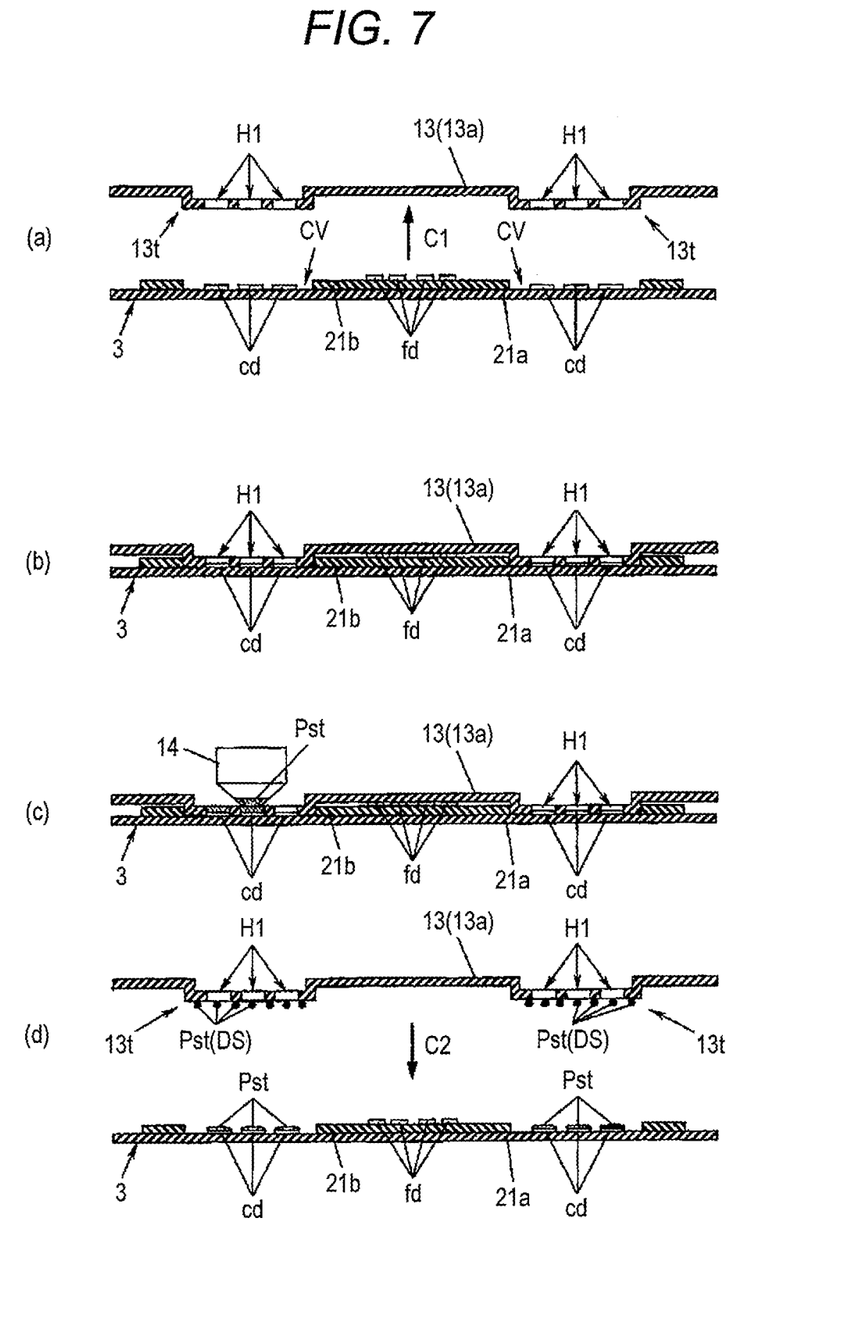

During the operation for positioning the substrate 3 with respect to the first mask 13a, the controller 50 of the first screen printer 2a controls operation of the camera actuation mechanism 55, thereby horizontally actuating the camera unit 15 at a position below the first mask 13a. The first camera 15a captures (recognizes) images of mask-side positioning marks (not shown) provided on the first mask 13a. Further, the second camera 15b captures (recognizes) images of substrate-side positioning marks (not shown) provided on the substrate 3. The substrate 3 is actuated in such a way that the positioning marks match in the vertical direction.

After having finished processing pertaining to the first positioning step, the controller 50 of the first screen printer 2a actuates the substrate positioning mechanism 52, thereby elevating the substrate 3 in conjunction with the substrate holding part 12 (as designated by arrow C1 shown in FIG. 7(a)), thereby bringing the upper surface of the substrate 3 into contact with the lower surface of the first mask 13a. The convex portions 13t of the first mask 13a fit into the corresponding cavities CV of the substrate 3 in the vertical direction. The first pattern holes H1 of the first mask 13a fit to the corresponding cavity electrodes cd of the substrate 3 in the vertical direction (FIG. 7(b), a first mask contact step).

After having finished performing processing pertaining to the first mask contact step, the controller 50 of the first screen printer 2a brings the guide member 14a of the paste feed head 14 into contact with an upper surface of the first mask 13a and subsequently feeds the paste Pst to respective interiors of the convex portions 13t of the first mask 13a from the paste feed head 14. The first pattern holes H1 of the first mask 13a are thereby filled with the paste Pst (FIG. 7(c), a first paste filling step).

After having finished performing processing pertaining to the first paste filling step, the controller 50 of the first screen printer 2a actuates the substrate positioning mechanism 52, thereby lowering the substrate 3 in conjunction with the substrate holding part 12 (as designated by arrow C2 shown in FIG. 7(d)) and relatively separating the substrate 3 and the first mask 13a away from each other in the vertical direction. The paste Pst is thereby transferred through the mask, whereupon the paste Pst is printed (transferred) onto the respective cavity-area electrodes cd of the substrate 3 (a first mask transfer step).

After having finished performing processing pertaining to the first mask transfer step, the controller 50 of the first screen printer 2a actuates the substrate positioning mechanism 52, thereby positioning the conveyor mechanism of the substrate holding part 12 to the conveyor mechanism of the substrate carry-out part 12b. After positioning the conveyor mechanism of the substrate holding part 12 to the conveyor mechanism of the substrate carry-out part 12b has ended, the substrate conveyance mechanism 51 is activated, thereby letting the substrate carry-out part 12b receive the substrate 3 from the substrate holding part 12. Subsequently, the substrate conveyance mechanism lets the substrate carry-out part 12b convey the substrate 3 out of the first screen printer 2a (a first substrate carry-out step).

When detected that the substrate 3 has been carried out of the first screen printer 2a and then loaded into the substrate carry-in part 12a by means of an un-illustrated detector, the controller 50 of the second screen printer 2b activates the substrate conveyance mechanism 51, thereby letting the substrate holding part 12 receive the substrate 3 from the substrate carry-in part 12a and hold the thus-received substrate (a second substrate holding step). After having let the substrate holding part 12 hold the substrate 3, the controller activates the substrate positioning mechanism 52, thereby actuating the substrate 3 in conjunction with the substrate holding part 12. The substrate 3 is thereby positioned with respect to the second mask 13b in such a way that the second pattern holes H2 provided in the second mask 13b oppose the respective flat-area electrodes fd provided on the substrate 3 in the vertical direction (FIG. 8(a), a second positioning step).

Figure 8:
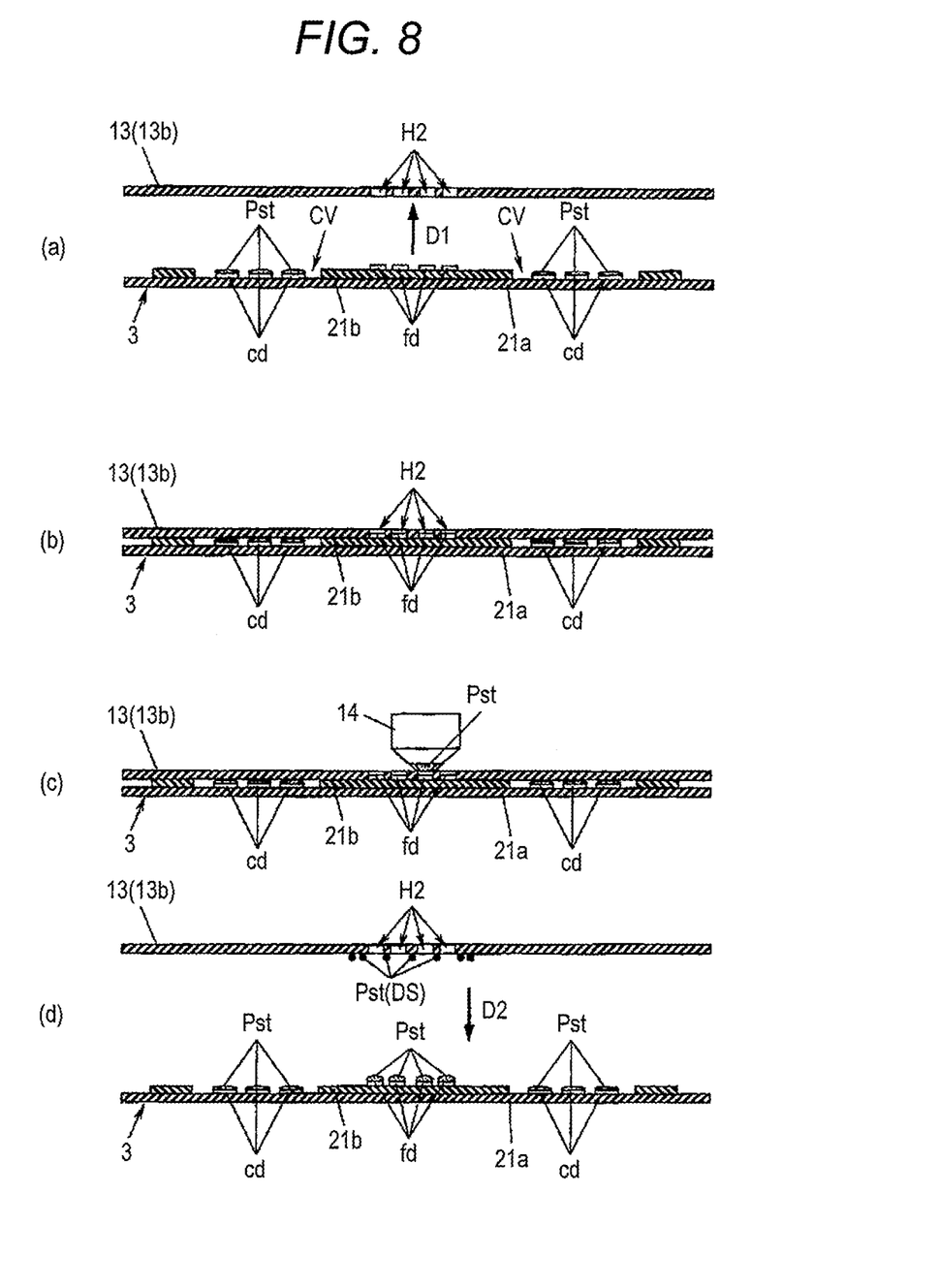

During the operation for positioning the substrate 3 with respect to the second mask 13b, the controller 50 of the second screen printer 2b controls operation of the camera actuation mechanism 55, thereby horizontally actuating the camera unit 15 at a position below the second mask 13b. The first camera 15a captures (recognizes) images of mask-side positioning marks (not shown) provided on the second mask 13b. Further, the second camera 15b captures (recognizes) images of substrate-side positioning marks (not shown) provided on the substrate 3. The substrate 3 is actuated in such a way that the positioning marks match in the vertical direction.

After having finished performing processing pertaining to the second positioning step, the controller 50 of the second screen printer 2b actuates the substrate positioning mechanism 52, thereby elevating the substrate 3 in conjunction with the substrate holding part 12 (as designated by arrow D1 shown in FIG. 8(a)), thereby bringing the upper surface of the substrate 3 into contact with the lower surface of the second mask 13b (FIG. 8(b)). The second pattern holes H2 of the second mask 13b fit into the corresponding flat-area electrodes fd of the substrate 3 in the vertical direction (a second mask contact step).

Since the cavity-area electrodes cd are provided in the respective cavities CV recessed in the upper surface of the substrate 3, the second mask 13b does not contact the paste Pst on the respective cavity-area electrodes cd even when the second mask 13b is brought into contact with the upper surface of the substrate 3 after printing of the paste Pst to the respective cavity electrodes cd has completed. (see FIG. 8(c))

After having finished performing processing pertaining to the second mask contact step, the controller 50 of the second screen printer 2b brings the guide member 14a of the paste feed head 14 into contact with an upper surface of the second mask 13b and subsequently feeds the paste Pst to the upper surface of the second mask 13b from the paste feed head 14. The second pattern holes H2 of the second mask 13b are thereby filled with the paste Pst. (FIG. 8(c), a second paste filling step)

After having finished performing processing pertaining to the second paste filling step, the controller 50 of the second screen printer 2b actuates the substrate positioning mechanism 52, thereby lowering the substrate 3 in conjunction with the substrate holding part 12 and relatively separating the substrate 3 and the second mask 12b away from each other in the vertical direction. (as designated by arrow D2 shown in FIG. 8(d)) The paste Pst is thereby transferred through the mask, whereupon the paste Pst is printed (transferred) onto the respective flat-area electrodes fd of the substrate 3. (a second mask transfer step)

After having finished performing processing pertaining to the second mask transfer step, the controller 50 of the second screen printer 2b actuates the substrate positioning mechanism 52, thereby positioning the conveyor mechanism of the substrate holding part 12 to the conveyor mechanism of the substrate carry-out part 12b. After positioning the conveyor mechanism of the substrate holding part 12 to the conveyor mechanism of the substrate carry-out part 12b has ended, the substrate conveyance mechanism 51 is activated, thereby letting the substrate carry-out part 12b receive the substrate 3 from the substrate holding part 12. Subsequently, the the substrate conveyance mechanism lets the substrate carry-out part 12b convey the substrate 3 out of the second screen printer 2b (a second substrate carry-out step). Processing pertaining to the step during which the screen print system 1 subjects the substrate 3 to screen printing is thereby completed.

In the screen print system 1 of the present embodiment, the substrate 3 is printed with the paste Pst along the procedures mentioned above. After processing pertaining to the screen print process has been performed the number of times equal to the number of the substrates 3, the controller 50 of the first screen printer 2a cleans the lower surface of the first mask 13a (the lower surface of the convex portion 13t) by use of the cleaning unit 16 (the first cleaning unit 16a) provided in the first screen printer 2a. After processing pertaining to the screen print process has been performed the number of times equal to the number of the substrates 3, the controller 50 of the second screen printer 2b cleans the lower surface of the second mask 13b by use of the cleaning unit 16 (the second cleaning unit 16b) provided in the second screen printer 2b.

Figure 9:
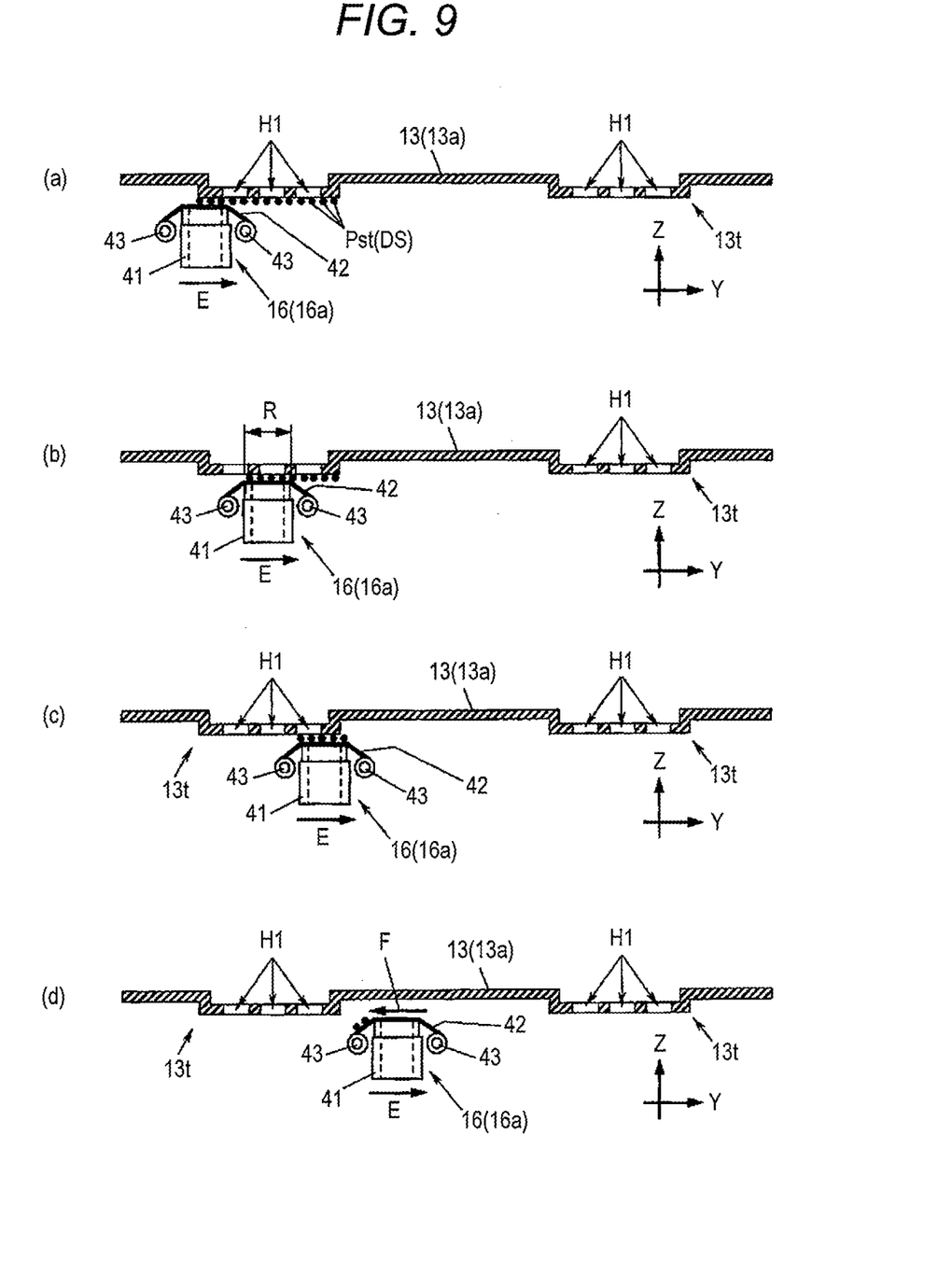

During operation for cleaning the first mask 13a in the first screen printer 2a, the controller 50 of the first screen printer 2a controls operation of the cleaning unit actuation mechanism 56, thereby bringing the mask contact area R of the paper member 42 of the first cleaning unit 16a into contact with one of the lower surfaces of the convex portions 13t of the first mask 13a (FIG. 9(a)) while actuating the entire first cleaning unit 16a in the direction of the horizontal plane (i.e., the Y-axis direction, as designated by arrow E shown in FIGS. 9(a) to 9(d)). The paste Pst (a residue DS of the paste Pst) adhering to the lower surface of the convex portions 13t of the first mask 13a then sticks to the mask contact area R of the paper member 42, to thus be eliminated. The lower surface of one of the convex portions 13t of the first mask 13a is thus cleaned.

After having cleaned the lower surface of one of the convex portions 13t, the controller 50 of the first screen printer 2a actuates the entire first cleaning unit 16a in the Y-axis direction in such a way that the mask contact area R of the paper member 42 contacts an adjoining convex portion 13t. The lower surface of the next convex portion 13t is now cleaned (FIG. 9(a)→FIG. 9(b)→FIG. 9(c)→FIG. 9(d)). The paste Pst is thereby removed from the lower surfaces of all of the convex portions 13t (a first paste removal step).

When performing cleaning of the paste Pst adhering to the lower surfaces of the respective convex portions 13t of the first mask 13a, the controller 50 of the first screen printer 2a actuates the paper member winding-up mechanism 57 in a period during which the mask contact area R of the paper member 42 of the first cleaning unit 16a remains in contact with the lower surface of the convex portion 13t; namely, while removing the paste Pst adhering to the lower surfaces of the convex portions 13t of the first mask 13a (as designated by arrow F shown in FIGS. 9(a) to (d), a paper member winding-up step). It is thereby possible to prevent the paste Pst removed from the previous convex portion 13t from being rubbed against a subsequent convex portion 13t, which would otherwise occur when the mask contact area contacts the next convex portion 13t to be subjected to removal of the paste Pst after removal of the paste Pst of one convex portion 13t of the first mask 13a has been completed.

The direction of movement of the paper member 42 with respect to the nozzle part 41 (i.e., a winding-up direction) achieved when the paper member 42 is winded up may also be identical with or opposite to the direction of actuation of the nozzle part 41 with respect to the first mask 13a. In either case, in order to efficiently remove (wipe out) the paste Pst by rubbing the paper member 42 against the first mask 13a, the paper member 42 must perform sliding action with respect to the first mask 13a while the nozzle part 41 is relatively actuated with respect to the first mask 13a. For this reason, the first cleaning unit 16a winds up the paper member 42 in the same direction in which the paper member 42 performs sliding action with respect to the first mask 13a and at the same speed at which the paper member 42 performs sliding action with respect to the first mask 13a. Specifically, the controller 50 of the first screen printer 2a makes the direction of movement of the paper member 42 with respect to the nozzle part 41 (i.e., the winding-up direction) identical with the direction of movement of the nozzle part 41 with respect to the first mask 13a or makes the direction of movement of the paper member 42 with respect to the nozzle part 41 opposite to the direction of movement of the nozzle part 41 with respect to the first mask 13a. Thus, the speed of movement of the paper member 42 performed with respect to the nozzle part 41 is prevented from becoming equal to the speed of movement of the nozzle part 41 performed with respect to the first mask 13a.

Figure 10:
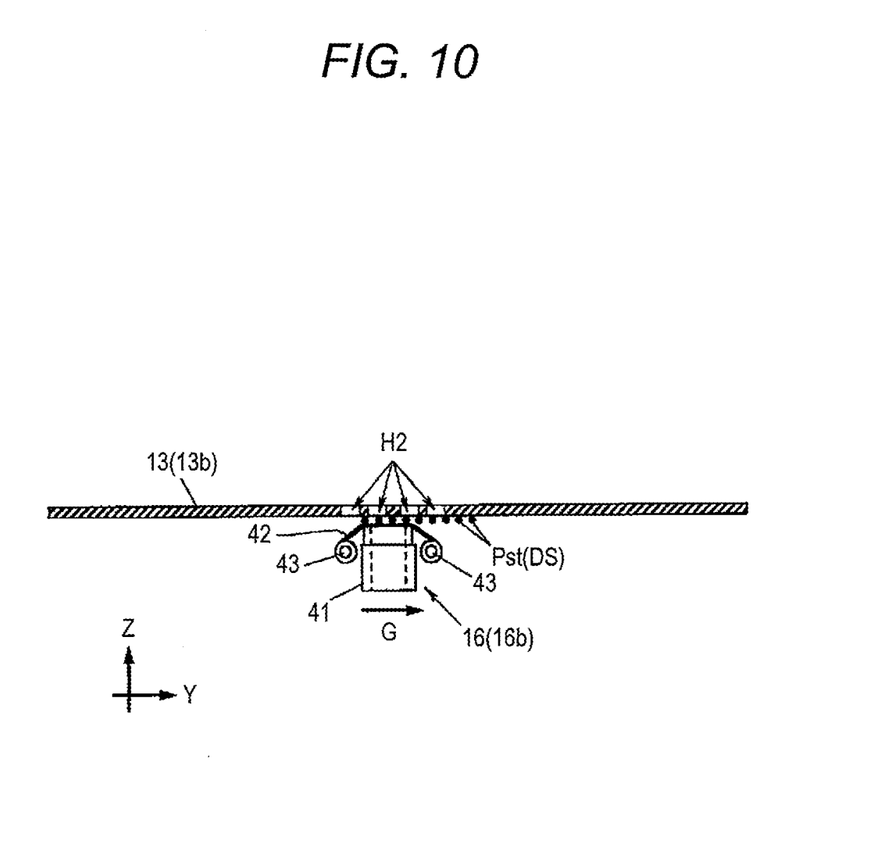
FIG. 10 is an explanatory operation diagram of the cleaning unit provided in the second screen printer of the embodiment of the present invention.

In the meantime, the controller 50 of the second screen printer 2b controls operation of the cleaning unit actuation mechanism 56 during operation for cleaning the second mask 13b of the second screen printer 2b, thereby bringing the mask contact area R of the paper member 42 of the second cleaning unit 16b into contact with the lower surface of the second mask 13b (FIG. 10) while actuating the entire second cleaning unit 16b in the direction of the horizontal plane (i.e., the Y-axis direction as designed by arrow G shown in FIG. 10). The paste Pst (i.e., the residue DS of the paste Pst) adhering the lower surface of the second mask 13b sticks to the mask contact area R of the paper member 42, to thus be removed. The lower surface of the second mask 13b is thus cleaned (a second paste removal step).

On the occasion of the cleaning of the first mask 13a of the first screen printer 2a and the second mask 13b of the second screen printer 2b, the controllers 50 of the screen printers 2a and 2b control operation of the suction mechanism 58, to thus remove air from the air suction conduit 41a by suction by way of the mask contact area R of the paper member 42. The paste Pst adhering the lower surface of each of respective masks 13 (the first mask 13a or the second mask 13b) is sucked out to the paper member 42, whereby removal of the paste Pst is effectively performed.

As mentioned above, the screen print system 1 of the present embodiment is built by coupling the first screen printer 2a to the second screen printer 2b. Specifically, the first screen printer 2a positions the substrate 3 having the plurality of cavity-area electrodes cd (the first electrodes) provided on the respective bottom surfaces of the plurality of cavities CV (apertures) formed in portions of the upper surface of the substrate main body 21 and the plurality of flat-area electrodes fd (the second electrodes) provided on the upper surface of the substrate body 21. The first mask 13a having the first pattern holes H1 that correspond to the respective cavity-area electrodes cd and that are formed in each of the plurality of downwardly-protruding convex portions 13t to be fit into respective cavities CV of the substrate body 21 is brought into contact with the upper surface of the substrate 3 by means of the first screen printer 2a, thereby subjecting the cavity-area electrodes cd to screen printing. The second screen printer 2b positions the substrate 3 subjected to screen printing by means of the first screen printer 2a and brings the flat-plate-shaped second mask 13b having the second pattern holes H2 corresponding to the respective flat-area electrodes fd into contact with the upper surface of the substrate 3, thereby subjecting the flat-area electrodes fd to screen printing. The screen print system 1 also includes the first cleaning unit 16a and the second cleaning unit 16b. The first cleaning unit 16a performs relative movement with respect to the first mask 13a, thereby sequentially bringing the mask contact area R, which is formed by stretching the paper member 42 over the upper end of the nozzle part 41 serving as a paper member support part, into contact with the lower surfaces of the respective convex portions 13t of the first mask 13a, thereby removing the paste Pst adhering to the respective lower surfaces of the respective convex portions 13t of the first mask 13a. The second cleaning unit 16b performs relative movement with respect to the second mask 13b, thereby bringing the mask contact area R, which is formed by stretching the paper member 42 over the upper end of the nozzle part 41, into contact with the lower surface of the second mask 13b, thereby removing the paste Pst adhering to the lower surface of the second mask 13b. The first cleaning unit 16a is equipped with paper member winding-up unit (i.e., the paper member winding-up mechanism 57) that winds up the paper member 42 while removing the paste Pst adhering to the lower surfaces of the convex portions 13t of the first mask 13a.

Further, the method for cleaning the mask 13 of the screen print system 1 of the present embodiment includes the step (the first paste removal step) of relatively actuating the first cleaning unit 16a having the mask contact area R, which is formed by stretching the paper member 42 over the upper end of the nozzle part 41 serving as the paper member support part, with respect to the first mask 13a, thereby sequentially bringing the mask contact area R into contact with the lower surfaces of the respective convex portions 13t of the first mask 13a, to thus remove the paste Pst adhering to the lower surfaces of the respective convex portions 13t of the first mask 13a. The method also includes another step (the second paste removal step) of relatively actuating the second cleaning unit 16b having the mask contact area R, which is formed by stretching the paper member 42 over the upper end of the nozzle part 41, with respect to the second mask 13b, thereby bringing the mask contact area R into contact with the lower surface of the second mask 13b, to thus remove the paste Pst adhering to the lower surface of the second mask 13b. In the step (the first paste removal step) of removing the paste Pst adhering to the lower surfaces of the respective convex portions 13t of the first mask 13a by means of the first cleaning unit 16a, the paper member 42 is winded up while removing the paste Pst adhering to the lower surfaces of the convex portions 13t of the first mask 13a.

As mentioned above, the screen print system 1 of the present embodiment (the method for cleaning the mask 13 of the screen print system 1) is configured so as to bring the mask contact area R of the paper member 42 into contact with the lower surfaces of the convex portions 13t of the first mask 13a, to thus winding-up the paper member 42 while removing the paste Pst adhering to the lower surfaces of the convex portions 13t. Therefore, when the paper member 42 contacts the next convex portion 13t to be subjected to removal of the paste Pst after removal of the paste Pst of one convex portion 13t, the paste Pst removed from the preceding convex portion 13t will not be rubbed against the subsequence convex portion 13t. For this reason, the mask 13 used for subjecting the cavity substrate to screen printing can be sufficiently cleaned, so that accuracy of printing can be enhanced.

The paper member 42 is winded up while removing the paste Pst adhering to the lower surfaces of the convex portions 13t. Even when the convex portions 13t are adjacent to each other at an extremely short distance, it is possible to reliably prevent the paste Pst removed from the preceding convex portion 13t from being rubbed against the subsequent convex portion 13t.

Although the embodiment of the present invention has been described thus far, the present invention is not limited to the embodiment. For instance, in the foregoing embodiment, the cleaning units 16 (the first cleaning unit 16a and the second cleaning unit 16b) provided in the respective screen printers 2 are actuated in the Y-axis direction that is the direction in the horizontal plane perpendicular to the direction of conveyance of the substrate 3 (i.e., the X-axis direction), to thus clean the lower surfaces of the respective masks 13. However, specific limits are not imposed on the directions of actuation of the respective cleaning units 16. The cleaning units can also be actuated in the X-axis direction that is parallel to the direction of conveyance of the substrate 3, to thus clean the lower surfaces of the masks 13.

The present patent application is based on Japanese Patent Application (JP-A-2009-284687) filed on Dec. 16, 2009, the entire subject matter of which is incorporated herein by reference.

INDUSTRIAL APPLICABILITY

There are provided a screen print system and a method for cleaning a mask of the screen print system that enable sufficient cleaning of the mask used for subjecting a cavity substrate to screen printing.

DESCRIPTIONS OF THE REFERENCE NUMERALS AND SYMBOLS

1 SCREEN PRINT SYSTEM
2a FIRST SCREEN PRINTER
2b SECOND SCREEN PRINTER
3 SUBSTRATE
13a FIRST MASK
13b CONVEX PORTION
16a FIRST CLEANING UNIT
16b SECOND CLEANING UNIT
21 SUBSTRATE BODY
41 NOZZLE PART (PAPER MEMBER SUPPORT PART)
42 PAPER MEMBER
58 PAPER MEMBER WINDING-UP MECHANISM (PAPER MEMBER WINDING-UP UNIT)
H1 FIRST PATTERN HOLE
H2 SECOND PATTERN HOLE
CV CAVITY (APERTURE)
cd CAVITY-AREA ELECTRODE (FIRST ELECTRODE)
fd FLAT-AREA ELECTRODE (SECOND ELECTRODE)
R MASK CONTACT AREA
Pst PASTE

The invention claimed is:

1. A screen print system comprising:
a first screen printer for positioning a substrate having a plurality of first electrodes provided on bottom surfaces of a plurality of cavities formed in portions of an upper surface of a substrate body and a plurality of second electrodes provided on the upper surface of the substrate body and bringing into contact with an upper surface of the substrate a first mask having first pattern holes that correspond to the first electrodes and that are formed in each of a plurality of downwardly-protruding convex portions to be fit into the cavities of the substrate body, so as to subject the first electrodes to screen printing;
a second screen printer for positioning the substrate subjected to the screen printing by means of the first screen printer and bringing a flat-plate-shaped second mask having second pattern holes corresponding to the second electrodes into contact with the upper surface of the substrate body, so as to subject the second electrodes to screen printing;
first and second cleaning units for cleaning the first and second masks, respectively, wherein the first cleaning unit performs a relative movement with respect to the first mask, thereby sequentially bringing a mask contact area, which is formed by stretching a paper member over an upper end of a paper member support part, into contact with lower surfaces of the convex portions of the first mask, thereby removing paste adhering to the lower surfaces of the convex portions of the first mask, and wherein the second cleaning unit performs a relative movement with respect to the second mask, thereby bringing the mask contact area, which is formed by stretching the paper member over the upper end of the paper member support part, into contact with a lower surface of the second mask, thereby removing paste adhering to the lower surface of the second mask, and wherein the first cleaning unit has a paper member winding-up unit that winds up the paper member; and
a controller for actuating a movement of the first cleaning unit from a lower surface of a first one of the convex portions to a lower surface of a second one of the convex portions after cleaning the lower surface of the first one of the convex portions, wherein the controller actuates the paper member winding-up unit while removing the paste adhering to the lower surface of the first one of the convex portions of the first mask and before moving the first cleaning unit to the lower surface of the second one of the convex portions to wind up the paper member.

2. A method for cleaning a mask of a screen print system comprising a first screen printer for positioning a substrate having a plurality of first electrodes provided on bottom surfaces of a plurality of cavities formed in portions of an upper surface of a substrate body and a plurality of second electrodes provided on the upper surface of the substrate body and bringing into contact with an upper surface of the substrate a first mask having first pattern holes that correspond to the first electrodes and that are formed in each of a plurality of downwardly-protruding convex portions to be fit into the cavities of the substrate body, thereby subjecting the first electrodes to screen printing, and a second screen printer for positioning the substrate subjected to the screen printing by means of the first screen printer and bringing a flat-plate-shaped second mask having second pattern holes corresponding to the second electrodes into contact with the upper surface of the substrate body, thereby subjecting the second electrodes to screen printing,
the method comprising a step of relatively actuating a first cleaning unit having a mask area, which is formed by stretching a paper member over an upper end of a paper member support part, with respect to the first mask, thereby sequentially bringing a mask contact area into contact with lower surfaces of convex portions of the first mask, to thus remove paste adhering to the lower surfaces of the convex portions of the first mask and another step of relatively actuating a second cleaning unit having the mask contact area, which is formed by stretching the paper member over the upper end of the paper member support part, with respect to the second mask, thereby bringing the mask contact area formed from a portion of the paper member into contact with a lower surface of the second mask, to thus remove the paste adhering to the lower surface of the second mask, wherein,
the method further comprises actuating a movement of the first cleaning unit from a lower surface of a first one of the convex portions to a lower surface of a second one of the convex portions after cleaning the lower surface of the first one of the convex portions, and actuating the paper member winding-up unit while removing the paste adhering to the lower surface of the first one of the convex portions of the first mask and before moving the first cleaning unit to the lower surface of the second one of the convex portions to wind up the paper member.

* * * * *